United States Patent
Pant et al.

[11] Patent Number: 5,644,230
[45] Date of Patent: Jul. 1, 1997

[54] MINIATURE MAGNETOMETER AND FLEXIBLE CIRCUIT

[75] Inventors: Bharat B. Pant, Minneapolis; Richard K. Spielberger, Maple Grove; Bruce W. Ohme, Minneapolis, all of Minn.

[73] Assignee: Honeywell Inc., Minneapolis, Minn.

[21] Appl. No.: 588,162

[22] Filed: Jan. 18, 1996

Related U.S. Application Data

[63] Continuation of Ser. No. 277,846, Jul. 20, 1994, abandoned.

[51] Int. Cl.$^6$ .............................. G01R 33/09; G01B 7/00; A61B 5/05; H05K 1/00
[52] U.S. Cl. .................. 324/247; 128/653.1; 174/254; 324/207.21; 324/219; 324/252; 361/749
[58] Field of Search ....................... 324/207.2, 207.21, 324/207.22, 219–221, 247, 251, 252; 600/11, 13; 174/52.1, 254; 361/749–751; 128/653.1, 737

[56] References Cited

U.S. PATENT DOCUMENTS

| | | |
|---|---|---|
| 4,533,872 | 8/1985 | Boord et al. . |
| 4,656,750 | 4/1987 | Pitt et al. ........................ 324/247 X |
| 4,727,866 | 3/1988 | Livesay et al. .................. 324/247 X |
| 4,860,756 | 8/1989 | Ko et al. .......................... 324/237 X |
| 4,905,698 | 3/1990 | Strohl, Jr. et al. ............... 324/219 X |
| 4,928,089 | 5/1990 | Gasiunas et al. ............. 324/207.22 X |
| 5,021,736 | 6/1991 | Gonsalves et al. ........... 324/207.21 X |
| 5,121,289 | 6/1992 | Gagliardi ......................... 324/200 X |
| 5,142,229 | 8/1992 | Marsden ......................... 324/247 X |
| 5,241,270 | 8/1993 | Ng .................................. 324/247 X |
| 5,247,278 | 9/1993 | Pant et al. . |

FOREIGN PATENT DOCUMENTS 030041  6/1981  European Pat. Off. .

OTHER PUBLICATIONS

C.H. Bajorek, et al, "A Permally Current Sensor", IEEE Transactions on Magnetics, vol. MAG–12, No. 6, Nov. 1976, pp. 813–815.

"Self Biased Magnetoresistive Bridge Configuration for Current Measurement", IBM Technical Disclosure Bulletin, vol. 18, No. 11, Apr. 1976, pp. 3847–3851.

Phillips Technical Publication 268, Phillips Components, May 1990, pp. 1–18.

"Magnetoresistive Sensors", Bharat B. Pant, Scientific Honeyweller, Fall 1987 pp. 29–34.

*Primary Examiner*—Gerard R. Strecker
*Attorney, Agent, or Firm*—Gregory A. Bruns

[57] ABSTRACT

Miniature magnetometer apparatus for use with external equipment in determining a position and orientation of a device located within a magnetic field includes an elongated flexible circuit for connection to external equipment, a substrate at the device with a portion of the flexible circuit secured thereto, and a planar sensor mounted on the flexible circuit at the substrate and connected to the flexible circuit.

8 Claims, 6 Drawing Sheets

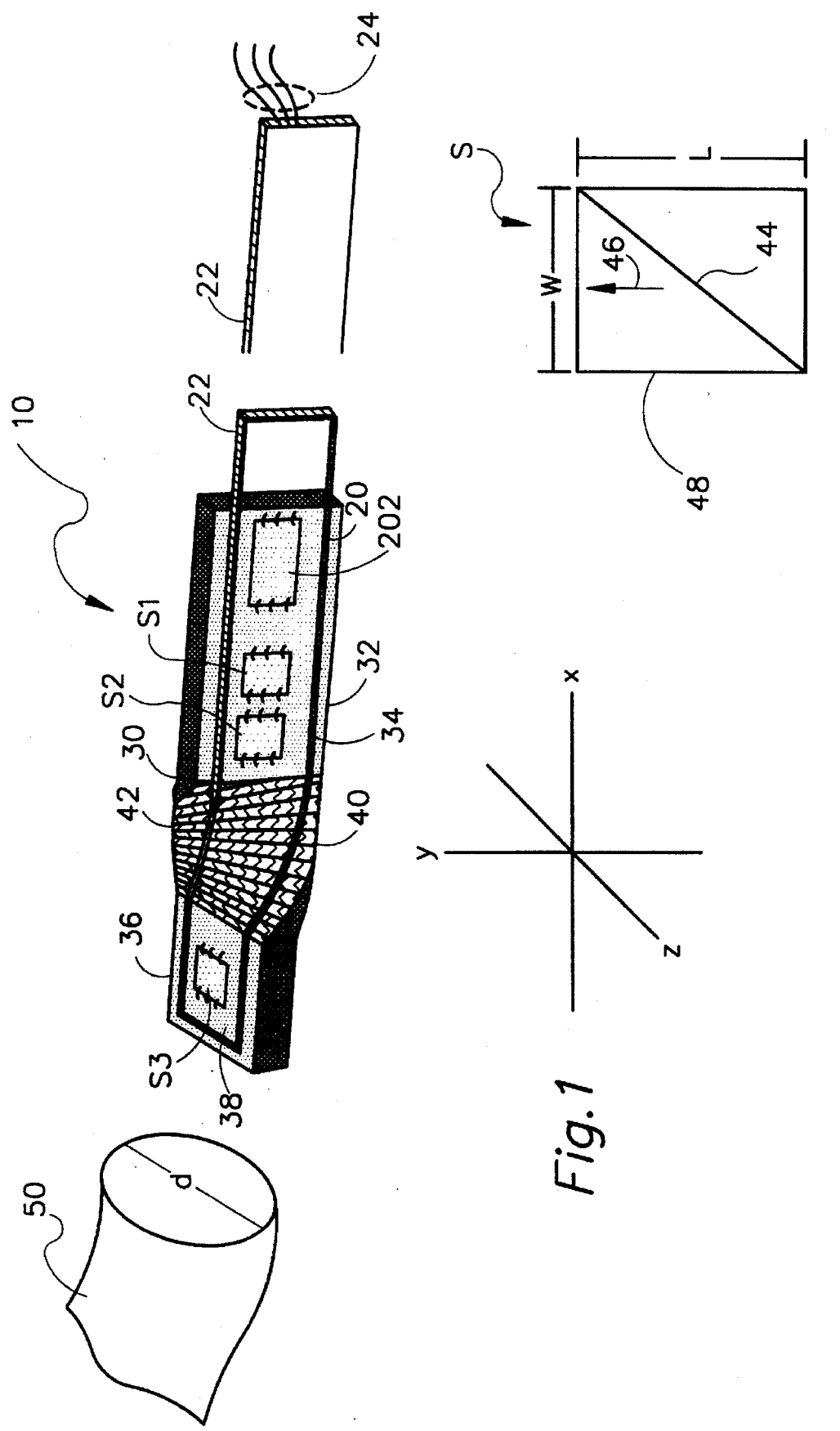

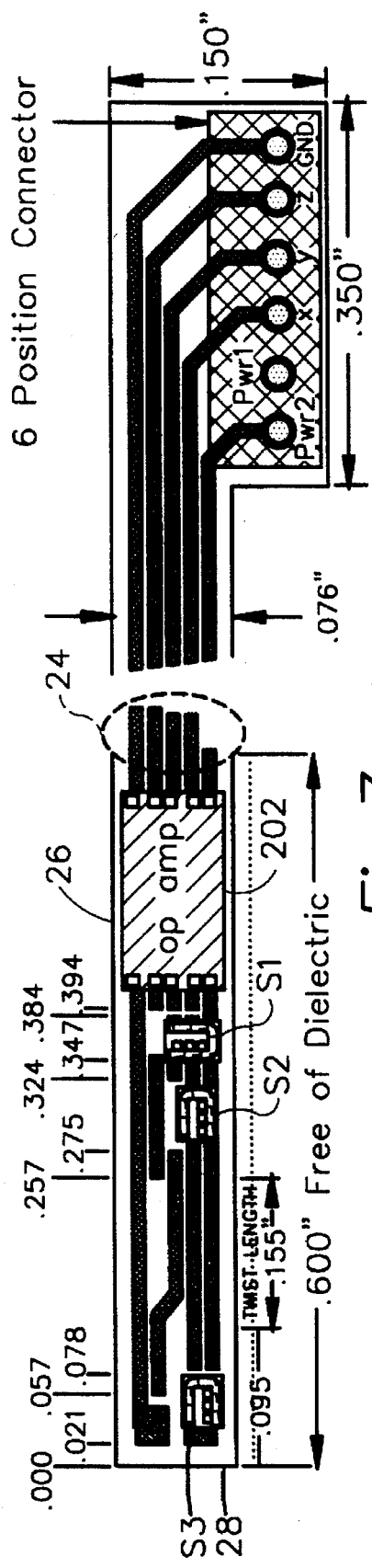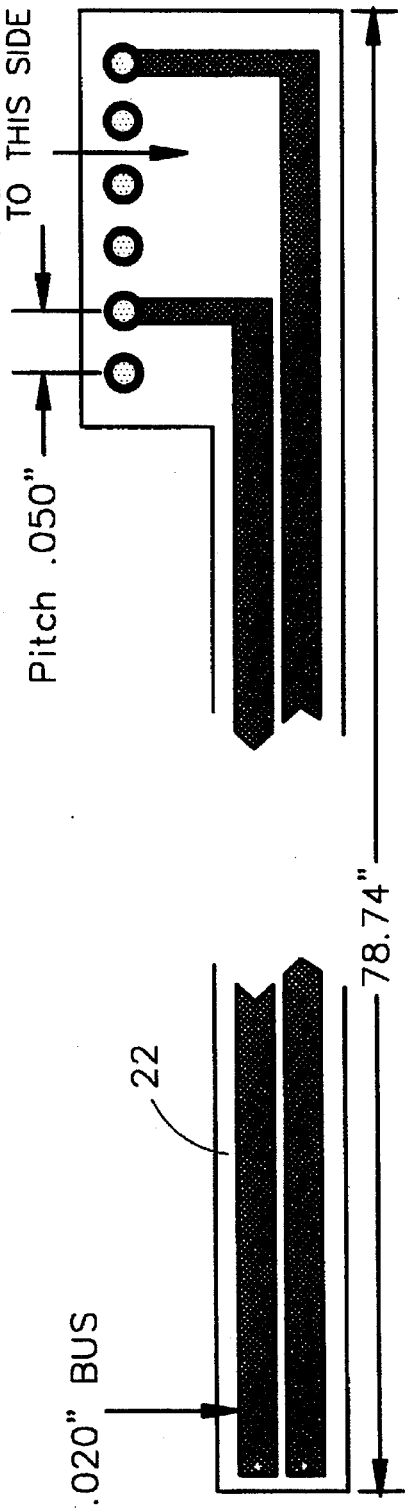
Fig. 7a
Fig. 7b

MINIATURE MAGNETOMETER AND FLEXIBLE CIRCUIT

This application is a continuation of application Ser. No. 08/277,846, filed Jul. 20, 1994, now abandoned.

BACKGROUND

This application is related to patent application Ser. No. 08/277,847.

The present invention is directed generally toward magnetometers and specifically to miniaturized magnetometer devices of the type that can be used in position and orientation sensing applications. When used in position and orientation applications, a magnetometer device is typically attached to or located within the item whose location or orientation is of interest. There is a need for such magnetometer devices wherever magnetic fields must be sensed with a fine resolution. Examples of position and orientation sensing include medical applications for the position and orientation of endoscopes and catheters where a flexible electrical connection of considerable length is needed to provide signals from the magnetometer to external monitoring equipment. In these applications and in many other applications, the available space for a magnetometer device is extremely limited.

Thus a need exists for a miniature magnetometer having an elongated flexible connecting circuit and capable of magnetic field sensing with a high degree of resolution.

SUMMARY OF THE INVENTION

The present invention solves these and other needs by providing a miniature magnetometer for use in determining the position and orientation of a device carrying the magnetometer within a magnetic field having known characteristics. The invention includes an elongated flexible circuit, a portion of which is supported by a substrate. Transducers having a direction of sensitivity in the plane of the transducer are mounted to the flexible circuit at the substrate. Signal conditioning electronics are also mounted to the flexible circuit at the substrate. Electrical connections interconnect the transducers, conditioning electronics and the flexible circuit.

BRIEF DESCRIPTION OF THE DRAWINGS

FIG. 1 illustrates a miniature magnetometer having an elongated flexible electrical connection according to the present invention.

FIG. 1a is an outline drawing of a sensor device.

FIGS. 7a and 7b are plan views of a flexible circuit.

DESCRIPTION

Figure 2A:
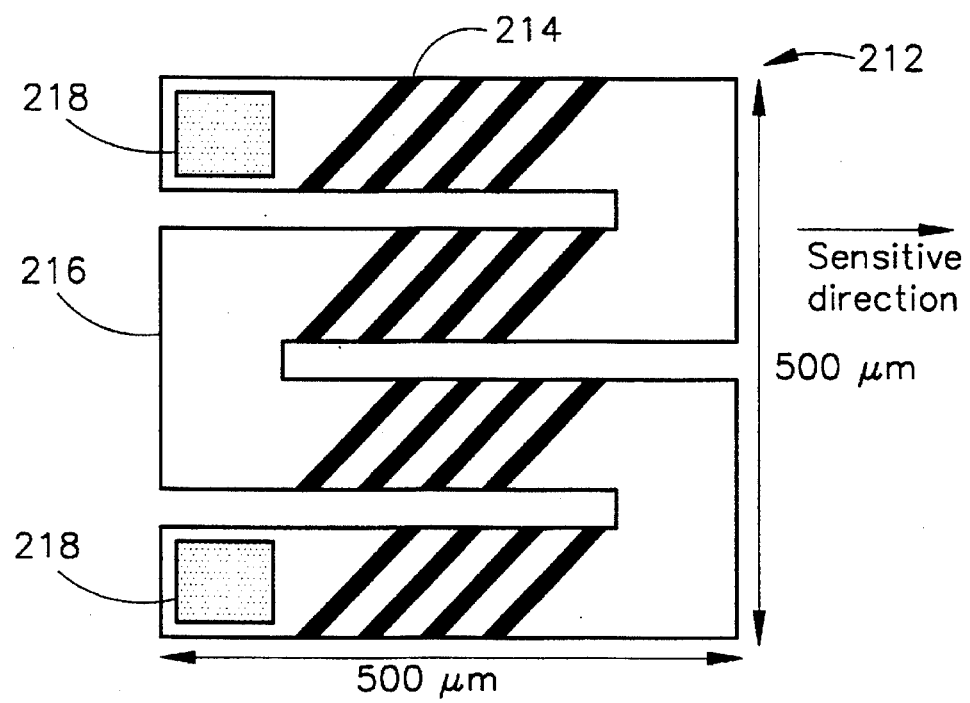
FIGS. 2a and 2b illustrate a plan view of single film transducers.

A magnetometer device in accordance with the principles of the present invention is illustrated in the Figures and generally designated 10. Device 10 includes transducer die S1, S2, and S3, a flexible circuit 20, a substrate or stiffener 30 to provide rigidity to a portion of flexible circuit 20, and signal conditioning electronics 202.

As shown in FIG. 1 substrate 30 has a first portion 32 having a surface 34 lying in a plane as formed by the x-axis and the y-axis and a second portion 36 having a surface 38 lying in a plane formed by the x-axis and the z-axis. Substrate 30 has a transition portion 40 extending from first portion 32 and connecting to second portion 36 and having a surface 42. Transition portion 40 is in the form of a twist that rotates through 90 degrees. Substrate 30 is made from a formable metal material and provides a greater stiffness to a portion of flexible circuit 20. Materials that have been found to work include Aluminum or Beryllium Copper.

In order to have a magnetometer device that will fit into the size anticipated for the applications of the present invention a very small transducer die must be provided.

An outline drawing of a sensor device S having a direction of sensitivity 46 and further having a length, l, a width, w, and a diagonal measurement 44, is shown in FIG. 1a. Sensors S are preferably of magnetoresistive material.

An advantage of the embodiment of FIG. 1 is that it accomplishes the three axis mounting of sensor devices in a way that allows apparatus 10 to be inserted in a passageway or orifice having a diameter measurement, d, that is less than diagonal measurement 44 of sensor device S. That is, the arrangement of FIG. 1 accomplishes the three axis sensing without presenting face 48 of sensor device S to the orifice or passageway 50. Unlike Hall-effect sensors which require the sensed field to be perpendicular to the plane of the sensor and therefore required a cube type of mounting, the sensor of the present invention is efficient in the cross-sectional area needed for mounting.

The transducer die may be of a single layer film implementation or a coupled film implementation. Transducer die 212 as illustrated in FIG. 2a is a single layer film wherein the four bridge legs would be arranged as a wheatstone bridge (connections not shown). In the single layer implementation, the herringbone design achieves the desired range of linearity by depositing series connected strips 214 at 45 degrees with respect to crossed bias and signal fields. The bias field can be applied either by an external magnet, external coils, or on chip straps. For purposes of miniaturization, the on chip strap 216 having connection pads 218 is the preferred method. Sample dimensions are also shown.

Figure 2B:
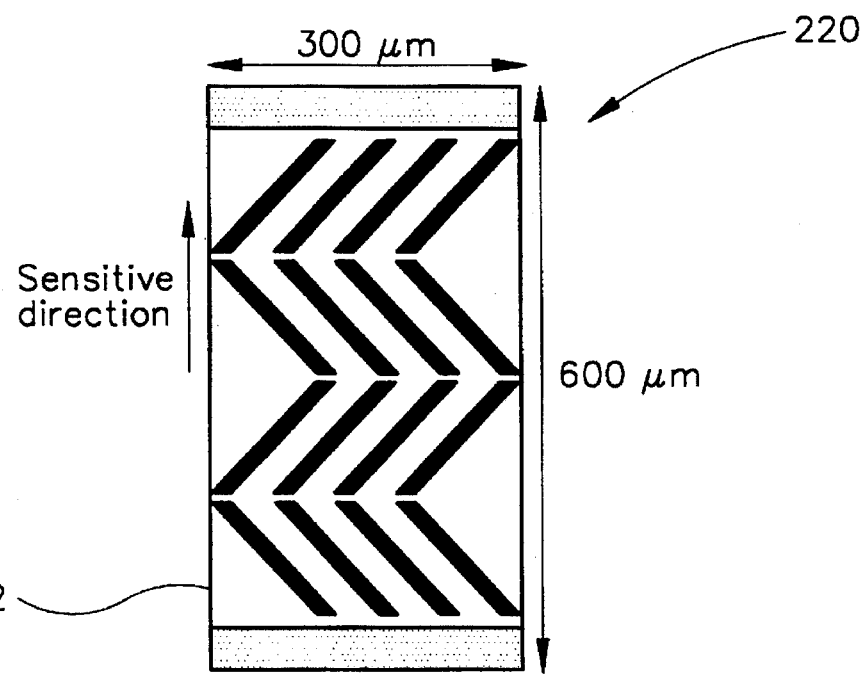

In FIG. 2b transducer 220 shows another arrangement of single film permalloy bridge legs and a setting strap 222 with sample dimensions shown.

Figure 3A:
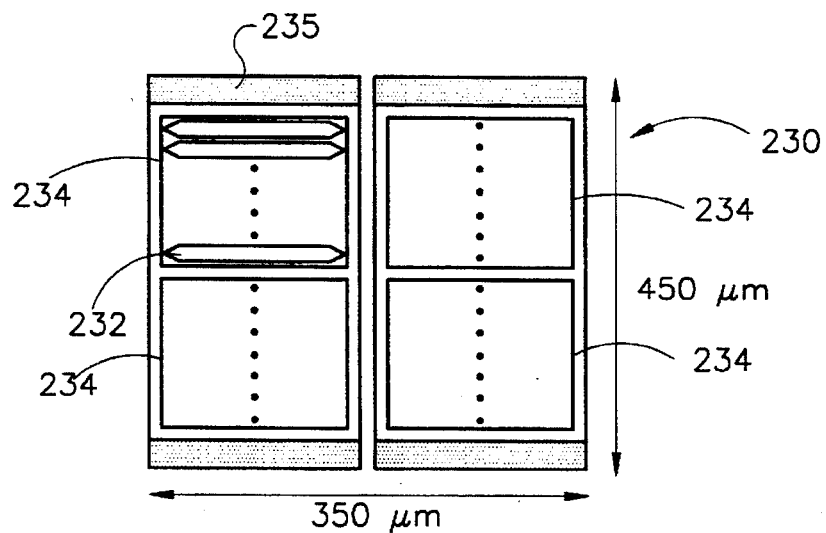
FIGS. 3a, b, and c, illustrate plan and sectional views of a coupled film transducer.

A coupled film transducer 230 is shown in FIG. 3a where magnetostatically coupled strips 232 are connected in series to form four legs 234 of a Wheatstone bridge (bridge connection not shown). Alternatively a two leg bridge arrangement may be used. In the coupled film implementation as shown in FIG. 3a each leg 234 consists of several strips 232, and all legs 234 have the same number of strips. Legs 234 differ in that one pair of opposite legs is magnetized in one direction along its length, whereas the remaining pair is magnetized in the opposite direction. This is done by applying an initial current pulse to strap 235 deposited on top of the strips. Once the legs are magnetized in this way, the top and bottom layers are brought to the appropriate point in the linear operation region by controlling the supply current. The bridge made up of such coupled films is sensitive to fields parallel to the length of the strips.

Figure 3B:
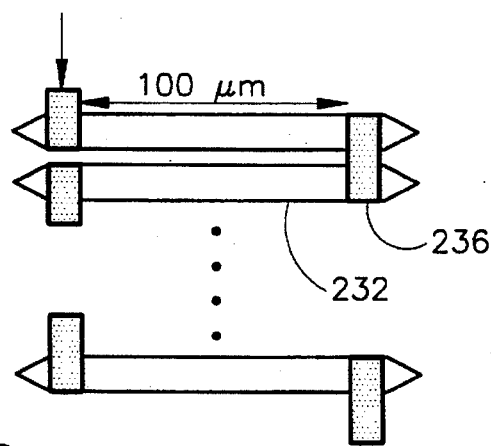

FIG. 3b illustrates the connection of strips 232 with interconnects 236 to form a leg 234.

Figure 3C:
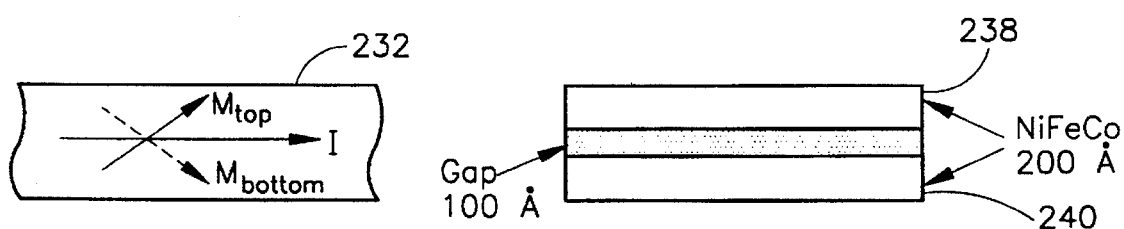

FIG. 3c illustrates a top view and an end cross-section view of a coupled film strip 232 in which the magnetization M in the top layer 238 and bottom layer 240 rotate as a function of the supply current I.

Further details of the construction of a coupled film transducer using either two legs or four legs are contained in a commonly owned U.S. patent application Ser. No. 08/277,856, now U.S. Pat. No. 5,500,590, entitled "Apparatus for Sensing Magnetic Fields using a Coupled Film Magnetoresistive Transducer" and having a filing date of Jul. 20, 1994 which is hereby incorporated by reference.

Figure 4:
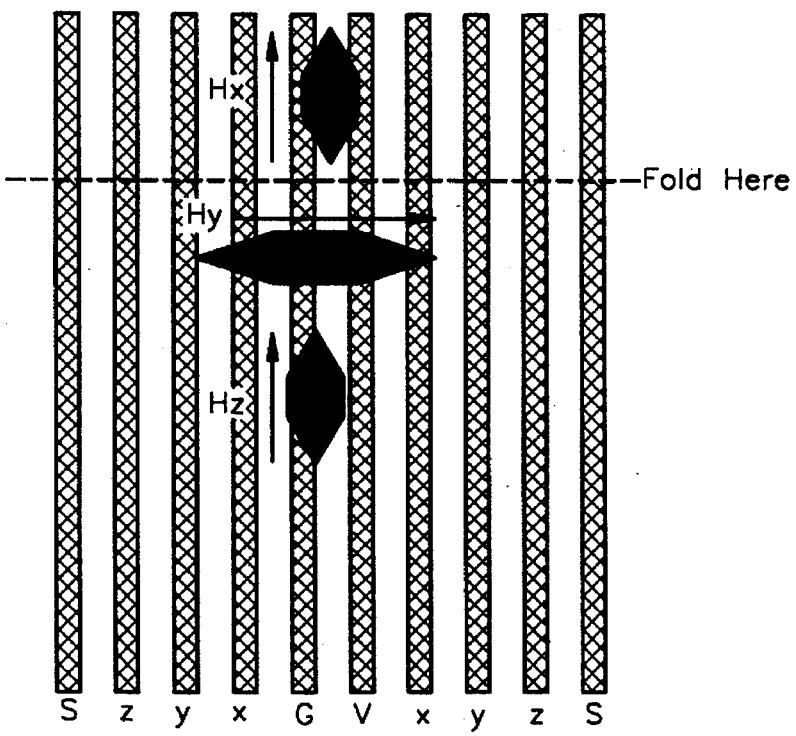
FIG. 4 illustrates three transducers in two planes.

Either single layer film transducers or coupled film transducers can be fabricated in chip sizes which are less than 1 mm on a side. Using the transducers described herein, miniature 3-axis magnetometers can be made by placing the transducer chips on two mutually orthogonal planes as illustrated in FIG. 4. This property of the transducers is very useful for purposes of miniaturization, and the purpose of FIG. 4 is only to illustrate this concept. The purpose of FIG. 4 is to illustrate the concept of using two mutually orthogonal planes to obtain three axis sensitivity. Further details of the structure for assembling a three axis sensor on two planes is contained in a commonly owned U.S. patent application Ser. No. 08/277,847 entitled "Three-Axis Packaging" having a filing date of Jul. 20, 1994 which is hereby incorporated by reference.

Figure 5:
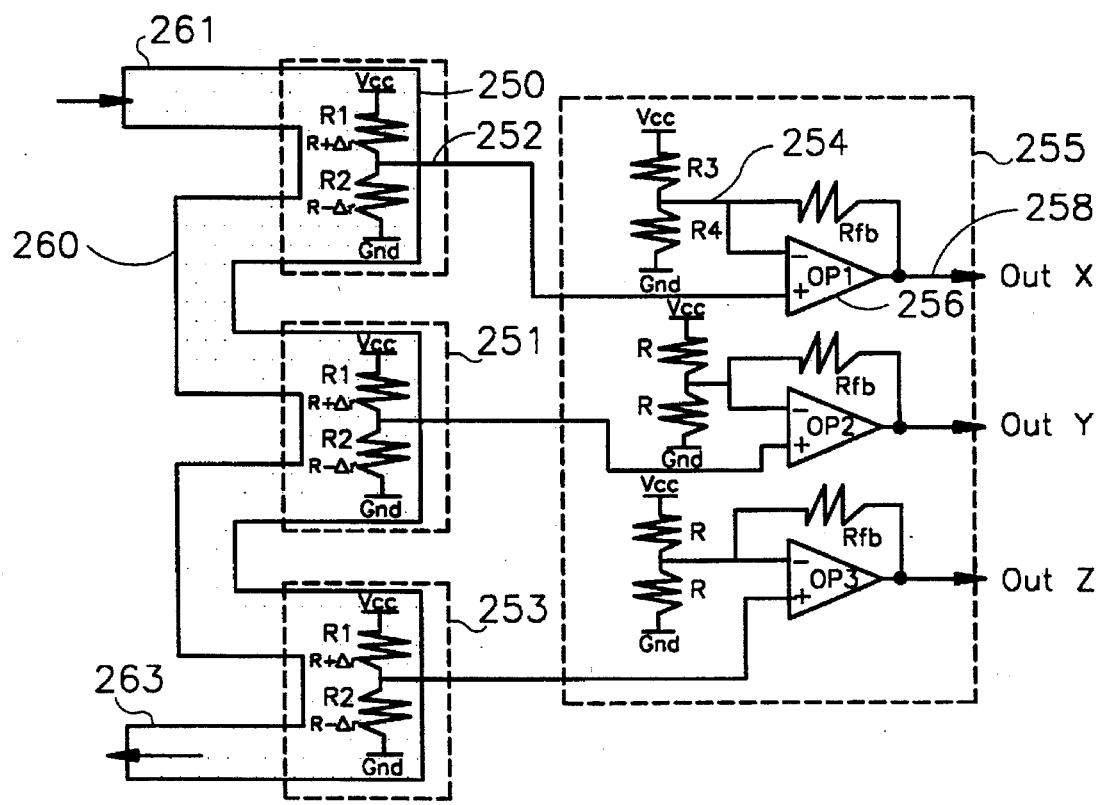
FIG. 5 is a schematic of three transducers combined with signal conditioning electronics in accordance with the present invention.

Three two-legged transducers can be combined with signal conditioning circuitry to provide a 3-axis magnetometer device as shown schematically in FIG. 5 where three die, i.e., x-axis die 250, y-axis die 251, and z-axis die 253, are physically oriented to sense magnetic field components along three orthogonal axis. Only transducer die 250 will be discussed as the circuitry for the three die is the same. Die 250 includes resistors R1 and R2 which are either single film or coupled film resistors of magnetoresistive material which are connected in series between a source of power and ground with a connection 252 between R1 and R2. Analog signal conditioning die 255 includes additional integrated components. Resistors R3 and R4 are non-magnetoresistive and are connected in series between a source of power and ground to form a voltage divider with a connection between R3 and R4. Op amp 256 senses the difference in voltage between connection 254 and connection 256 and provides an output signal 258. The operation of the Y-axis and the Z-axis is identical to the X-axis. Feedback resistor $R_{fb}$ and Op Amp 256 should be integrated and have matched temperature characteristics to provide stable gain. Op amp 256 should have high input impedance and low noise. Set reset strap 260 is used to set magnetic domains and to modify the transfer function. Set reset strap 260 accepts current at 261 and returns current at 263 which may be tied to ground.

A three axis magnetometer such as the present invention is capable of measuring the three components of a magnetic field in a region of interest in space. By appropriately setting or establishing the magnetic field in the region of interest, the output of a magnetometer can be used to extract orientation and position information of the magnetometer or the device to which it is attached. A uniform magnetic field in the region of interest is sufficient for sensing the orientation of a magnetometer whereas a known gradient or non-uniformity in the field is necessary for position information. By providing both a uniform field and a non-uniform field superimposed at distinct frequencies, both the position and orientation information may be extracted simultaneously.

Flexible circuit 20 includes tape 22 and conductors 24. Surface 26 of flexible circuit 20 located near end 28 does not include dielectric and conductors 24 are exposed to allow electrical connections to be made. Flexible circuit 20 is typically made using a polyimide dielectric and copper conductors. Photolithography and etching processes are used in the fabrication. The construction of the flexible tape may be varied. Planar views of one satisfactory prototype are shown in FIG. 7a and 7b, and a description of the materials and approximate dimensions is as follows:

DIELECTRIC MATERIAL=POLYIMIDE
WIDTH=0.076"
LENGTH=78.74"
POLYMIDE THICKNESS=0.002"
CONDUCTOR MATERIAL=COPPER
COPPER THICKNESS=0.0007"
EXPOSED COPPER PLATED WITH 20–40 MICROINCHES NICKEL
80 MICROINCHES WIREBONDABLE GOLD TO BE PLATED OVER NICKEL
COPPER LINE WIDTH TOP=0.005"
SPACE BETWEEN COPPER LINES ON TOP=0.005"
METALLIZATION TO EDGE CLEARANCE=0.0155"
COPPER WIDTH ON BOTTOM 2 BUSES=0.020" EACH
SPACE BETWEEN BUSES=0.005"
BOTTOM BUSES CONNECTED TO THE TOP LINES AS SHOWN WITH THRU VIAS
VIAS MAY BE FILLED WITH A CONDUCTIVE PASTE
BOTTOM SIDE TO BE COATED WITH A DIELECTRIC
TOP SIDE TO BE COATED WITH A DIELECTRIC EXCEPT FOR THE 0.600" TIP
CIRCUIT SENSOR END TO BE BONDED TO 0.006" THICK BERYLLIUM COPPER
ASSUME SENSOR CHIP SIZE 0.025"×0.035"
ALLOW 0.020" AROUND THE CHIP TO BRING OUT THE WIRE BONDS
EACH CHIP FOOTPRINT WILL THEN BE 0.065"×0.075"
OP AMP CHIP SIZE IS 0.063"×0.154"

In the prototype previously described the Beryllium Copper substrate 30 is 0.575" long before forming a 90 degree twist in substrate 30 after a portion of flexible circuit 20 is bonded to the beryllium copper.

Electrical connections between the sensor and the flexible tape and between the signal conditioning electronics may be by wirebond, tape automated bonding (TAB) or other means.

In many medical devices, of which a catheter is one example, a three-axis sensing apparatus must be extremely small to be able to be inserted into a small channel or passageway within the device.

While the invention has been described with reference to a device such as a catheter having a small passageway, there are many other applications for the miniature magnetometer. Thus Applicant's invention provides a miniature three-axis magnetometer having milli-gauss resolution.

Figure 6:
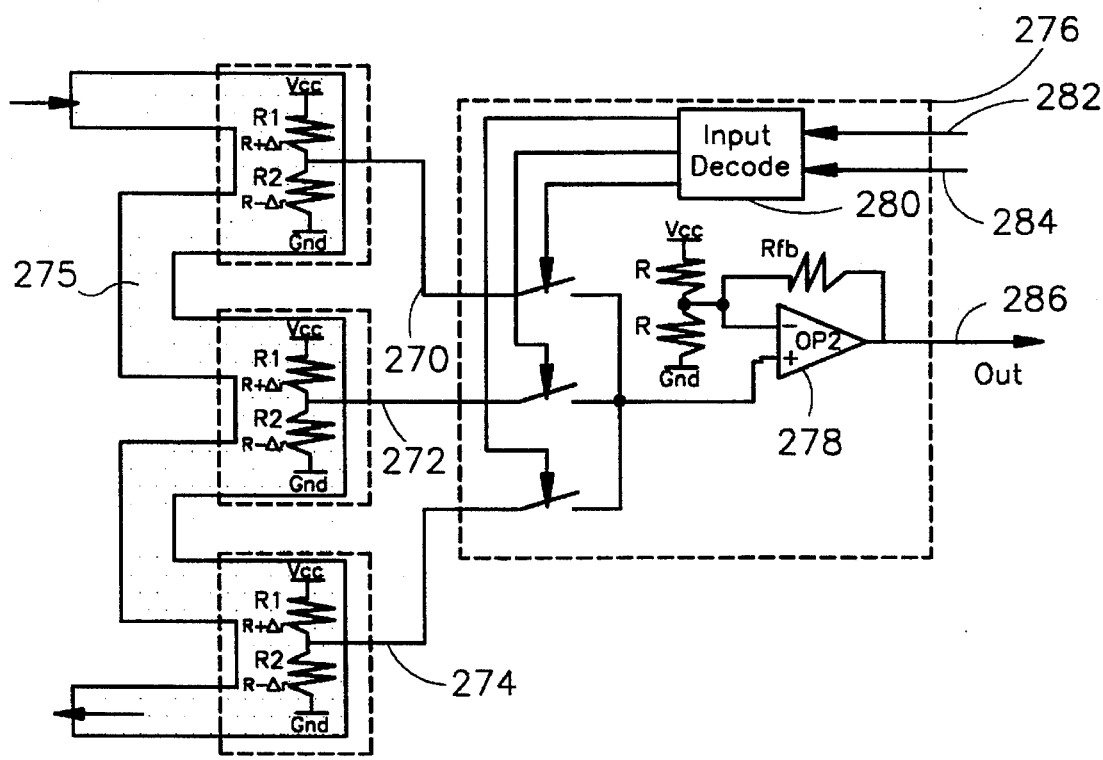
FIG. 6 illustrates an alternative embodiment of the present invention.

An alternative embodiment using a multiplexing approach to reduce die area is shown in FIG. 6 in which the three die are oriented as in FIG. 5. In the alternative embodiment, connections 270, 272 and 274 from X-axis Die, Y-axis die and Z-axis die are input to analog signal conditioning die 276. The arrangement of set reset current strap 275 is the same as in FIG. 5. Analog die 276 has only one Op amp 278. Input decoder 280 on analog die 276 selects which of connections 270, 272 or 274 is input to Op Amp 278. Input decoder 280 makes a selection based on the presence or absence of control signals 282 and 284. Input decoder 280 should not add any significant noise to the system. Output signal 286 represents the magnetic field component for the specific transducer die selected by input decoder 280.

The present invention has been described with reference to three-axis sensing; however, it is recognized that the principles of the invention also apply to two-axis sensing and single-axis sensing.

We claim:

1. A miniature magnetometer apparatus for use with external monitoring equipment to determine a position of a portion of a medical device located within a first magnetic field, said medical device having an elongated passageway for holding said magnetometer apparatus, comprising:

an elongated flexible tape having conductors and further having a first end portion, a second end portion, an intermediate portion and a first length, said first end portion having electrical connection means for connection to said external monitoring equipment, said length related to a length of said passageway;

said intermediate portion conforming to a changing form of said passageway;

a substrate having a first surface and a second surface orthogonal to said first surface, said second end portion secured to said first surface and to said second surface;

a first sensor means mounted on said flexible tape at said first surface, said first sensor means having a direction of sensitivity in a first direction lying in a plane of said first sensor means;

second sensor means mounted on said flexible tape at said first surface, said second sensor means having a direction of sensitivity in a second direction lying in a plane of said second sensor means;

a third sensor means mounted on said flexible tape at said second surface, said third sensor means having a direction of sensitivity in a third direction lying in a plane of said third sensor means, with said first, second and third directions being mutually perpendicular; and means for electrically connecting said first, second and third sensor means to said conductors to provide first, second and third output signals representative of said magnetic field components in said first, second and third directions respectively to permit determination of a location of said substrate and thereby said location of a said portion of said medical device.

2. Apparatus of claim 1 wherein said elongated flexible tape is formed from a single continuous flexible tape portion.

3. Apparatus of claim 1 further comprising a signal conditioning die mounted at said substrate and connected to said first sensor means and to said conductors.

4. Apparatus of claim 3 wherein said signal conditioning die includes a feedback resistor.

5. Apparatus of claim 4 wherein said signal conditioning die includes multiplexing means.

6. Apparatus of claim 1 wherein said first sensing means comprises a single layer magnetoresistive transducer.

7. Apparatus of claim 1 wherein said first sensing means comprises a coupled film transducer.

8. Apparatus of claim 1 wherein said portion of said medical device is located within a second magnetic field and said first, said second and said third sensor means provide fourth, fifth and sixth output signals, respectively, to permit determination of an orientation of said medical device.

* * * * *